(12) United States Patent
Chong et al.

(10) Patent No.: US 6,391,731 B1
(45) Date of Patent: May 21, 2002

(54) ACTIVATING SOURCE AND DRAIN JUNCTIONS AND EXTENSIONS USING A SINGLE LASER ANNEAL

(75) Inventors: Yung Fu Chong; Kin Leong Pey; Alex See, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/784,251

(22) Filed: Feb. 15, 2001

(51) Int. Cl.$^7$ ............................................. H01L 21/336
(52) U.S. Cl. ...................... 438/303; 438/305; 438/528; 438/487
(58) Field of Search ................ 438/303–307, 438/528–530, 487

(56) References Cited

U.S. PATENT DOCUMENTS

| | | | |
|---|---|---|---|
| 5,770,486 A | 6/1998 | Zhang et al. | 438/163 |
| 5,891,766 A | 4/1999 | Yamazaki et al. | 438/163 |
| 5,937,325 A | 8/1999 | Ishida | 438/655 |
| 5,966,605 A | 10/1999 | Ishida | 438/299 |
| 5,998,272 A | 12/1999 | Ishida et al. | 438/305 |
| 6,225,176 B1 * | 5/2001 | Yu | 438/305 |
| 6,297,115 B1 * | 10/2001 | Yu | 438/305 |

* cited by examiner

Primary Examiner—Jey Tsai
(74) Attorney, Agent, or Firm—George O. Saile; Rosemary L. S. Pike; Douglas R. Schnabe

(57) ABSTRACT

A new method of forming MOS transistors with shallow source and drain extensions and deep source and drain junctions in the manufacture of an integrated circuit device has been achieved. Gates are provided overlying a semiconductor substrate. Temporary sidewall spacers are formed on the gates. Ions are implanted into the exposed semiconductor substrate to form a deep amorphous layer. Ions are implanted into the deep amorphous layer to form pre-annealed source and drain junctions. The temporary sidewall spacers are removed. Ions are implanted into the exposed semiconductor substrate to form a shallow amorphous layer. Ions are implanted into the shallow amorphous layer to form pre-annealed source and drain extensions. A capping layer may be deposited overlying the semiconductor substrate and the gates to protect the semiconductor substrate during irradiation. The semiconductor substrate is irradiated with laser light to melt the amorphous layer while the crystalline regions of the semiconductor substrate remain in solid state. Ions in the pre-annealed source and drain junctions diffuse in the deep amorphous layer while ions in the pre-annealed source and drain extensions diffuse into the shallower amorphous layer. The source and drain junctions and the source and drain extensions for the transistors are thereby simultaneously formed.

20 Claims, 5 Drawing Sheets

US 6,391,731 B1

ACTIVATING SOURCE AND DRAIN JUNCTIONS AND EXTENSIONS USING A SINGLE LASER ANNEAL

BACKGROUND OF THE INVENTION (1) Field of the Invention

The invention relates to a method of fabricating semiconductor structures, and more particularly, to a method of forming MOS transistors with shallow junctions using laser annealing in the manufacture of an integrated circuit device.

(2) Description of the Prior Art

Sub-0.1 micron MOS technology requires the use of abrupt, ultra-shallow junctions for deep source and drains and for source and drain extensions. Traditional processing approaches have used ion implantation followed by rapid thermal annealing (RTA) to activate the implanted ions. However, RTA may not be capable for sub-0.1 micron technology because the RTA thermal ramp-up and ramp-down times are too large and can cause too much diffusion in the substrate. Furthermore, in some cases, two RTA cycles are required: one to form the source and drain extension and one to form the deep source and drain.

Several prior art approaches disclose methods to form source and drain junctions in the manufacture of integrated circuit devices. U.S. Pat. No. 5,998,272 to Ishida et al teaches a method to form salicide and deep source-drain regions prior to source-drain extension formation. A laser doping process is used in one embodiment. U.S. Pat. No. 5,937,325 to Ishida discloses a method to form silicide on an MOS gate. A titanium layer is deposited. A laser anneal is performed to form silicide. After removing unreacted metal, an RTA is performed to decrease the resistivity of the silicide. U.S. Pat. No. 5,966,605 to Ishida teaches a method to activate ions in the polysilicon gate. An ion implant is performed to dope the gate and the source and drain regions. A laser anneal is performed on the polysilicon gate but the unactivated ions do not diffuse in the source and drain regions. An RTA is then performed to activate the source and drain ions. U.S. Pat. No. 5,770,486 to Zhang et al and U.S. Pat. No. 5,891,766 to Yamazaki et al disclose methods to form thin film transistors. A laser anneal is used on the lightly doped drain (LDD) region. Related U.S. patent application Ser. No. 09/614557 (CS-00-003/004) to Y. F. Chong et al filed on Jul. 12, 2000, discloses a method to form transistors wherein a pre-amorphization implant and a laser anneal are used in conjunction with a spacer overetch.

SUMMARY OF THE INVENTION

A principal object of the present invention is to provide an effective and very manufacturable method to form MOS transistors in the manufacture of an integrated circuit device.

A further object of the present invention is to attain excellent doping profile and activation control for ultra-shallow source and drain extensions and deep source and drain junctions.

A yet further object of the present invention is to replace rapid thermal anneal (RTA) activation with laser annealing.

A still yet further object of the present invention is to improve dopant profile control by using a pre-amorphization ion implant and a laser anneal.

A further object of the present invention is to simultaneously activate shallow source and drain extensions and deep source and drain junctions using a single laser anneal.

In accordance with the objects of this invention, a new method of forming MOS transistors with shallow source and drain extensions and deep source and drain junctions in the manufacture of an integrated circuit device has been achieved. Gates are provided overlying a semiconductor substrate. Each gate comprises a gate oxide layer overlying the semiconductor substrate and a polysilicon layer overlying the gate oxide layer. Temporary sidewall spacers are formed on the gates. Ions are implanted into the exposed semiconductor substrate to form a deep amorphous layer. Ions are implanted into the deep amorphous layer to form pre-annealed source and drain junctions. The temporary sidewall spacers are removed. Ions are implanted into the exposed semiconductor substrate to form a shallow amorphous layer. Ions are implanted into the shallow amorphous layer to form pre-annealed source and drain extensions. A capping layer may be deposited overlying the semiconductor substrate and the gates to protect the semiconductor substrate during irradiation. The semiconductor substrate is irradiated with laser light to melt the amorphous layer while the crystalline regions of the semiconductor substrate remain in solid state. Ions in the pre-annealed source and drain junctions diffuse into the deep amorphous layer while ions in the pre-annealed source and drain extensions diffuse into the shallow amorphous layer. The source and drain junctions and the source and drain extensions for the transistors are thereby simultaneously formed to complete the MOS transistors.

BRIEF DESCRIPTION OF THE DRAWINGS

In the accompanying drawings forming a material part of this description, there is shown.

DESCRIPTION OF THE PREFERRED EMBODIMENTS

The embodiments disclose the application of the present invention to the formation of MOS transistors with shallow junctions in the manufacture of an integrated circuit device. The source and drain extensions and source and drain junctions are annealed simultaneously by a single laser anneal. It should be clear to those experienced in the art that the present invention can be applied and extended without deviating from the scope of the present invention.

Figure 1:
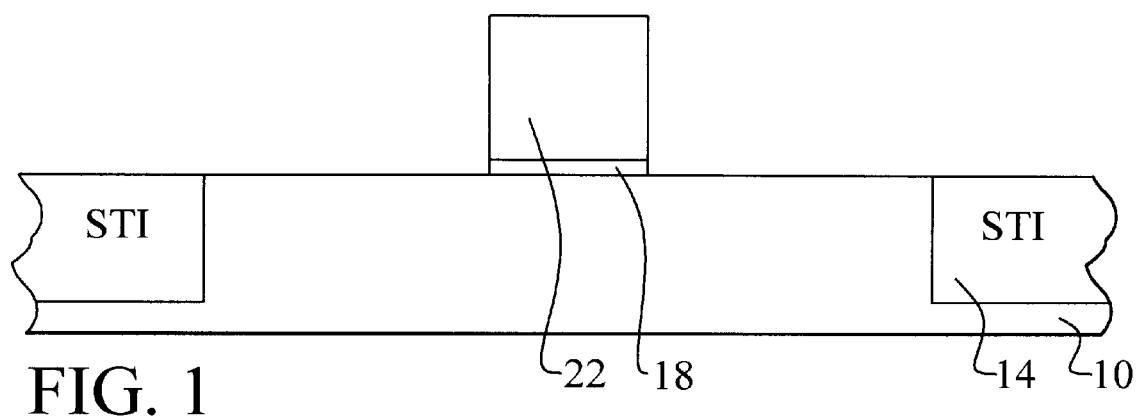
FIGS. 1 through 11 schematically illustrate in cross-sectional representation the preferred embodiment of the present invention.

Referring now particularly to FIG. 1, there is shown a cross-sectional representation of the partially completed preferred embodiment of the present invention. A semiconductor substrate 10 is provided. The semiconductor substrate 10 preferably comprises monocrystalline silicon. Shallow trench isolations (STI) 14 are formed in the semiconductor substrate 10 to define the active regions of the integrated circuit device. Alternatively, field oxide regions, formed using a local oxidation of silicon (LOCOS) technique, could be used in place of the STI regions 14.

A transistor gate 18 and 22 is formed overlying the semiconductor substrate 10 by conventional methods. For example, a gate dielectric layer 18, such as gate oxide, is formed overlying the semiconductor substrate 10. The gate dielectric layer 18 preferably comprises silicon dioxide that may be formed by thermal oxidation or by chemical vapor deposition (CVD). The gate dielectric layer 18 of the preferred embodiment is formed to a thickness of between about 10 Angstroms and 150 Angstroms.

A conductive gate layer 22 is deposited overlying the gate dielectric layer 18. The conductive gate layer 22 may comprise a polysilicon layer 22 deposited using, for example, a low-pressure chemical vapor deposition (LPCVD) process. The conductive gate layer 22 is preferably deposited to a thickness of between about 500 Angstroms and 2,500 Angstroms.

The conductive gate layer 22 and the gate dielectric layer 18 are patterned to form the conductive gates for the transistors. The patterning step may be performed using a conventional photolithographic mask and etch sequence. In this scheme, a photoresist material, not shown, is deposited overlying the polysilicon layer 22. The photoresist material is exposed to light through a patterned mask and then developed. The remaining photoresist forms a surface mask which allows the polysilicon layer 22 and the gate dielectric layer 18 to be selectively etched away. The remaining photoresist layer is then stripped.

Figure 2:
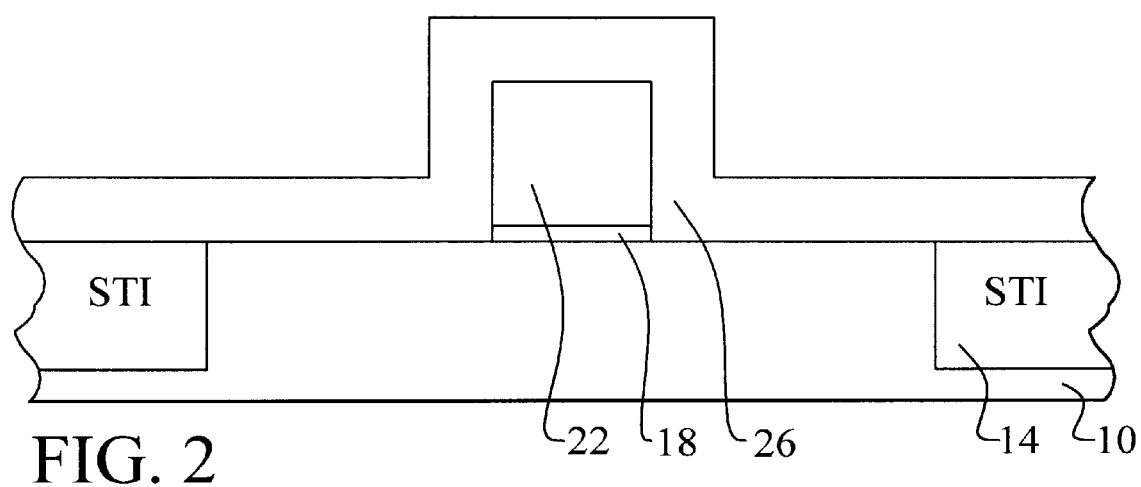

Referring now to FIG. 2, a dielectric layer 26 is deposited overlying the semiconductor substrate 10 and the conductive gate 22. The dielectric layer 26 will be later etched to form a temporary sidewall spacer on the gate 22. The dielectric layer 26 preferably comprises silicon dioxide or silicon nitride that is deposited by a chemical vapor deposition (CVD) process. The dielectric layer 26 is deposited to a thickness of between about 200 Angstroms and 1,500 Angstroms.

Figure 3:
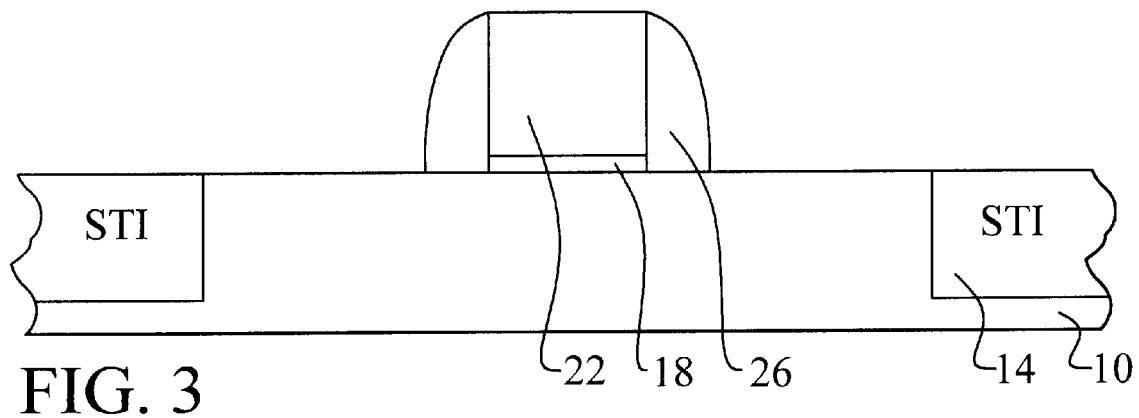

Referring now to FIG. 3, the dielectric layer 26 is anisotropically etched to form temporary sidewall spacers 26 on the gate 22. Significantly, the method of the present invention does not require over etching of the sidewall spacers to improve the process margin for the pre-amorphized extension area. This is because the method of the present invention uses two, separate amorphization implants. The first implant pre-amorphizes the source and drain region. The second implant, which is performed after the sidewall spacers 26 are removed, pre-amorphizes the extension regions.

Figure 4:
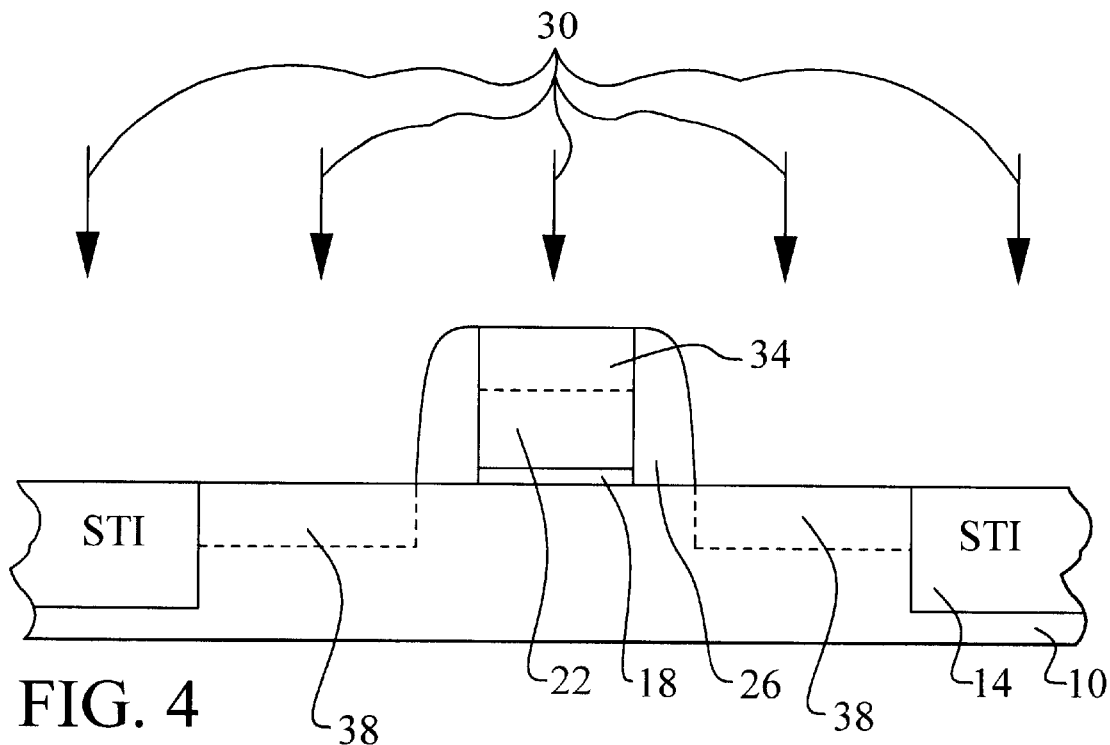

Referring now to FIG. 4, an important step in the method of the present invention is illustrated. Ions are implanted 30 into the exposed semiconductor substrate 10 to form a deep amorphous layer 38 in the semiconductor substrate 10. Preferably, Si, Ge, or Ar ions are implanted to break lattice bonds and to create a non-crystalline or amorphous silicon layer in the semiconductor substrate 10. By carefully selecting the weight of the ion, the implantation dose, and the implantation energy, a deep amorphous layer 38 can be created. The amorphous layer 38 so formed is critical to the present invention because it exhibits a lower melting point than crystalline or polycrystalline silicon. The ion implantation 30 also forms an amorphous layer 34 in the exposed polysilicon layer 22.

The ion implantation 30 is preferably performed at an energy of between about 10 KeV and 50 KeV and a dosage of between about $1 \times 10^{14}$ atoms/cm$^2$ and $1 \times 10^{16}$ atoms/cm$^2$. The deep amorphous layer 38 has a depth of between about 300 Angstroms and 1,500 Angstroms.

Figure 5:
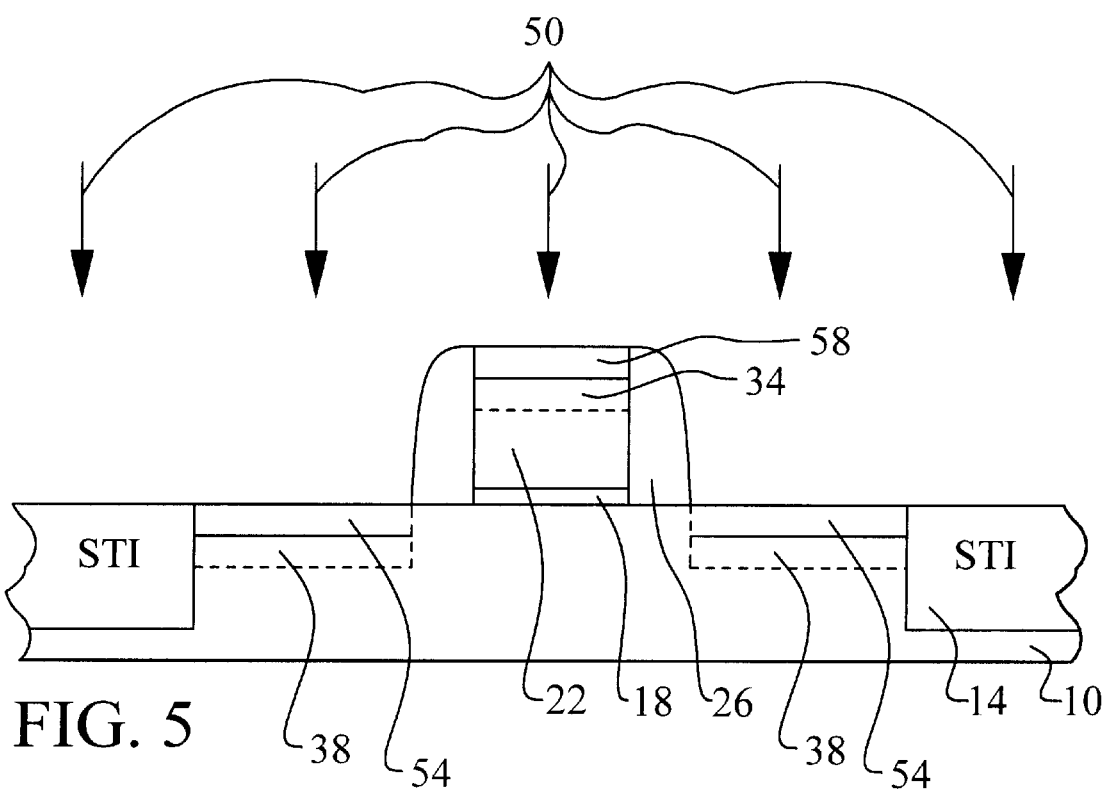

Referring now to FIG. 5, an important feature of the present invention is illustrated. Ions are implanted 50 into the deep amorphous layer 38 to form pre-annealed source and drain junctions 54 in the amorphous layer 38. These heavily doped junctions 54 will later be annealed to form the source and drain junctions of the transistor. Note also that the implantation forms a heavily doped junction 58 in the amorphous layer 34 of the gate. Preferably, B$^+$, BF$_2^+$, As$^+$, or P$^+$ ions are implanted at an energy of between about 2 KeV and 30 KeV and a dose of between about $1 \times 10^{15}$ atoms/cm$^2$ and $3 \times 10^{16}$ atoms/cm$^2$. The pre-annealed source and drain junctions 54 so formed have a depth of between about 200 Angstroms and 1,400 Angstroms.

Figure 6:
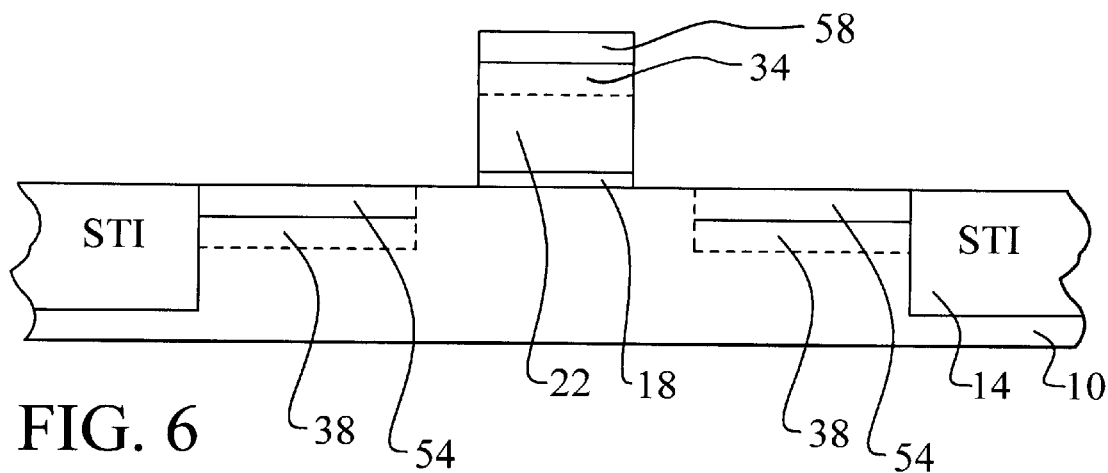

Referring now to FIG. 6, an important feature of the present invention is shown. The temporary sidewall spacers 26 are removed. The presence of the temporary sidewall spacers 26 has enabled the deep amorphous layer 38 and pre-annealed source and drain junctions 54 to be formed. The removal of the temporary sidewall spacers 26 at this point facilitates the formation of the shallow amorphous layer and the pre-annealed extensions.

Figure 7:
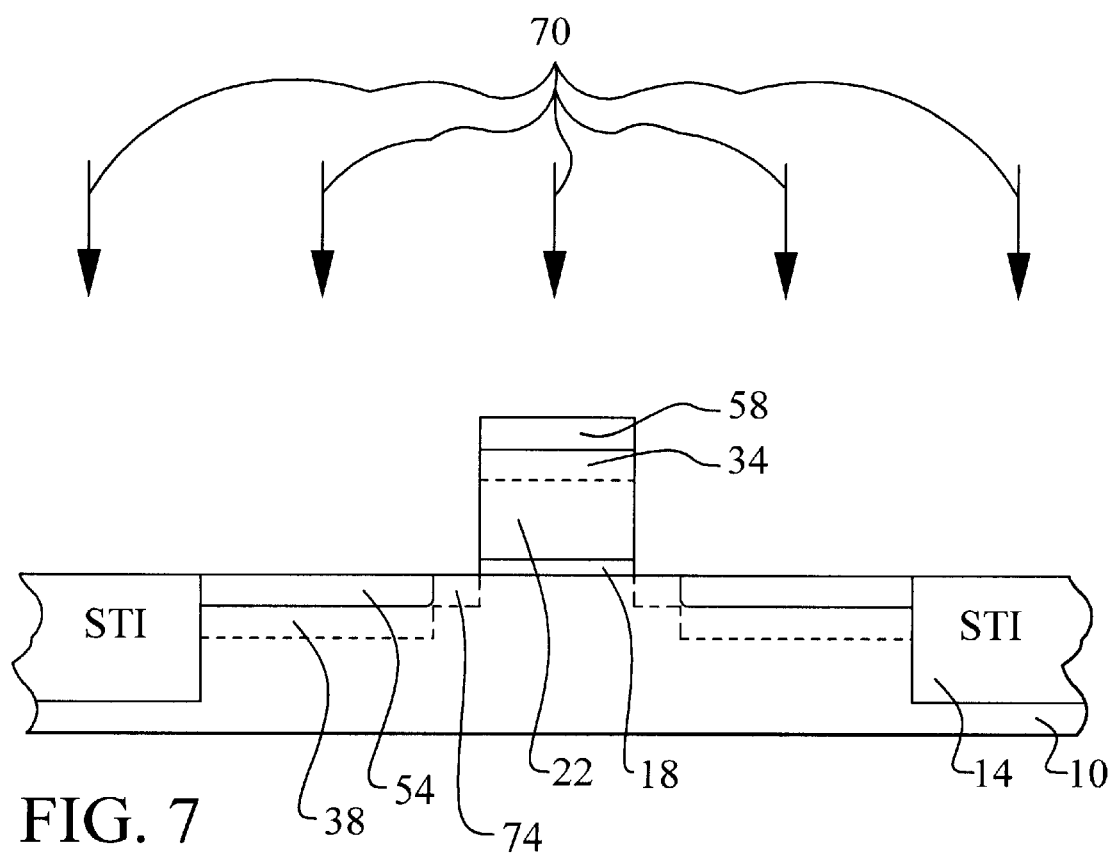

Referring now to FIG. 7, another important feature of the present invention is shown. Ions are implanted 70 into the exposed semiconductor substrate 10 to form a shallow amorphous layer 74 in the semiconductor substrate 10. Preferably, Si, Ge, or Ar ions are implanted to break lattice bonds and to create a non-crystalline or amorphous silicon layer in the semiconductor substrate 10. By carefully selecting the weight of the ion, the implantation dose, and the implantation energy, a shallow amorphous layer 74 can be created with an ultra-shallow depth suitable for an extension. The shallow amorphous layer 74 so formed is critical to the present invention because it exhibits a lower melting point than crystalline or polycrystalline silicon.

The ion implantation 70 is preferably performed at an energy of between about 3 KeV and 30 KeV and a dosage of between about $1 \times 10^{14}$ atoms/cm$^2$ and $1 \times 10^{16}$ atoms/cm$^2$. The shallow amorphous layer 74 has a depth of between about 100 Angstroms and 600 Angstroms.

Figure 8:
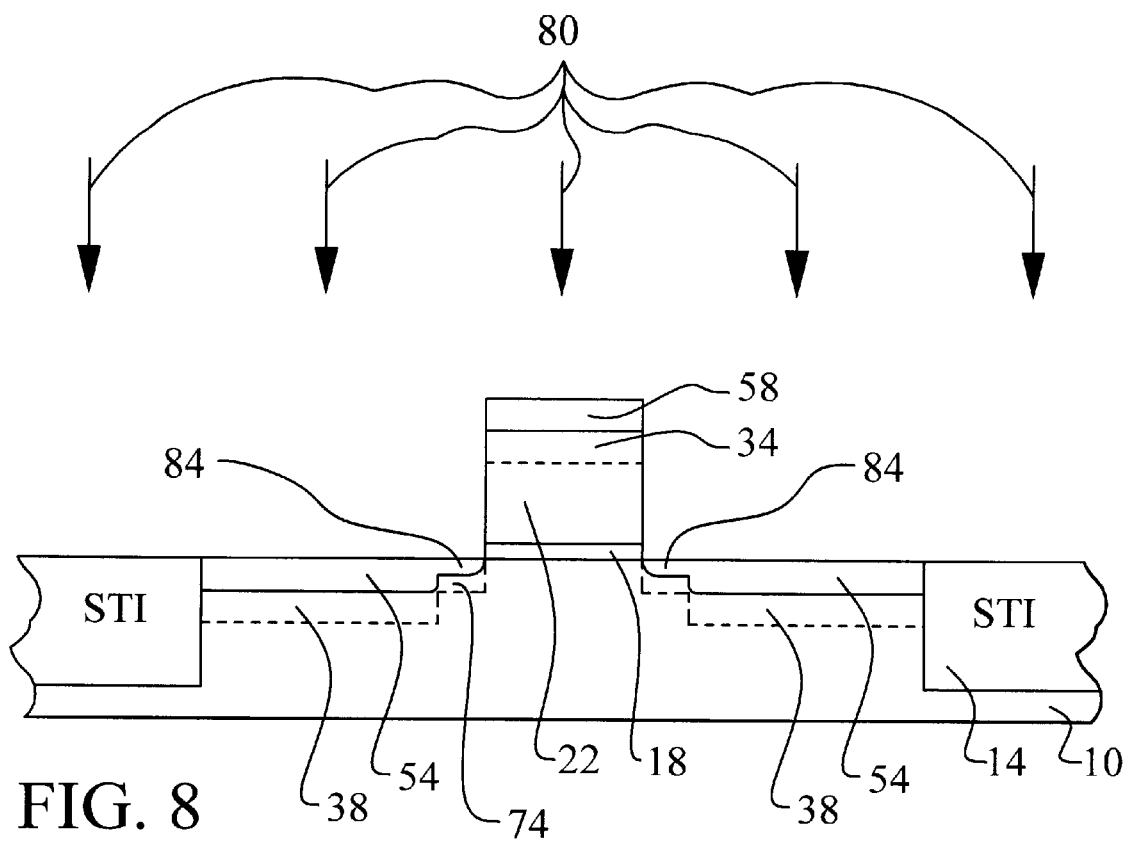

Referring now to FIG. 8, ions are implanted 80 into the shallow amorphous layer 74 to form pre-annealed source and drain extensions 84. The pre-annealed source and drain extensions 84 so formed are self-aligned to the gate 22 of the transistor. Note that the pre-annealed source and drain extensions 84 are very shallow. Preferably, B$^+$, BF$_2^+$, As$^+$, or P$^+$ ions are implanted at an ultra-low implant energy of between about 0.1 KeV and 10 KeV and a dose of between about $5 \times 10^{14}$ atoms/cm$^2$ and $1 \times 10^{16}$ atoms/cm$^2$. The pre-annealed source and drain extensions 84 so formed have a depth of between about 40 Angstroms and 500 Angstroms.

Figure 9:
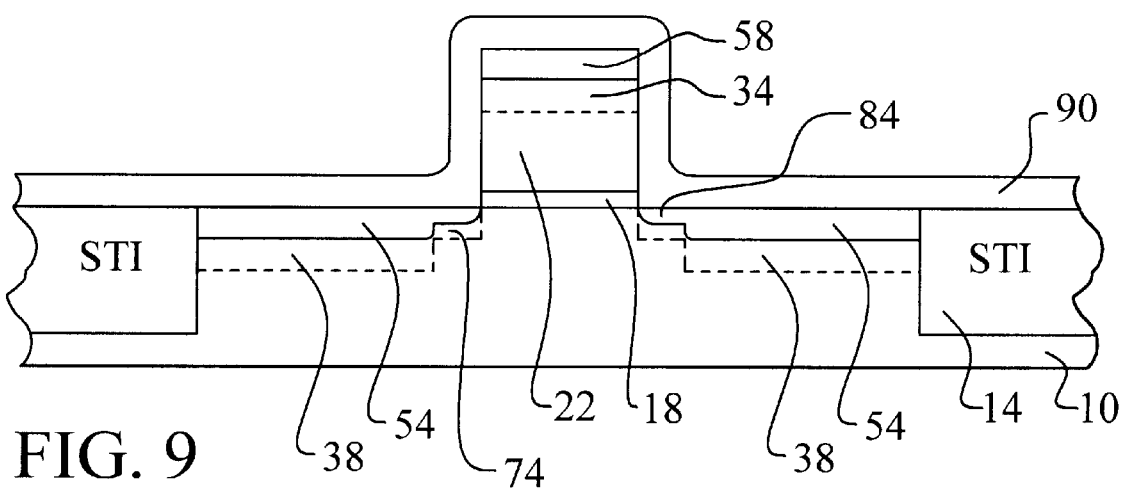

Referring now to FIG. 9, an important feature of the present invention is shown. A capping layer 90 may be deposited overlying the semiconductor substrate 10 and the gate 22. The capping layer 90 is optional to the present invention. If used, the capping layer 90 controls the temperature distribution profile across the silicon during the subsequent laser anneal. The capping layer 90 must comprise material that has a higher melting point than silicon so that it will not melt during the laser anneal. The capping layer 90 protects the silicon surface by acting as a barrier between the silicon and the ambient. In addition, the capping layer 90 must transmit the irradiated laser light to the underlying semiconductor substrate 10.

The capping layer 90 preferably comprises W, Ta, TiN, or TaN. Other common metal oxides and metal nitrides may also be used for the capping layer 90. The thickness of the capping layer 90 can be selected to control the temperature profile across the silicon. In this preferred embodiment, the capping layer 90 is deposited to a thickness of between about 50 Angstroms and 500 Angstroms.

Figure 10:
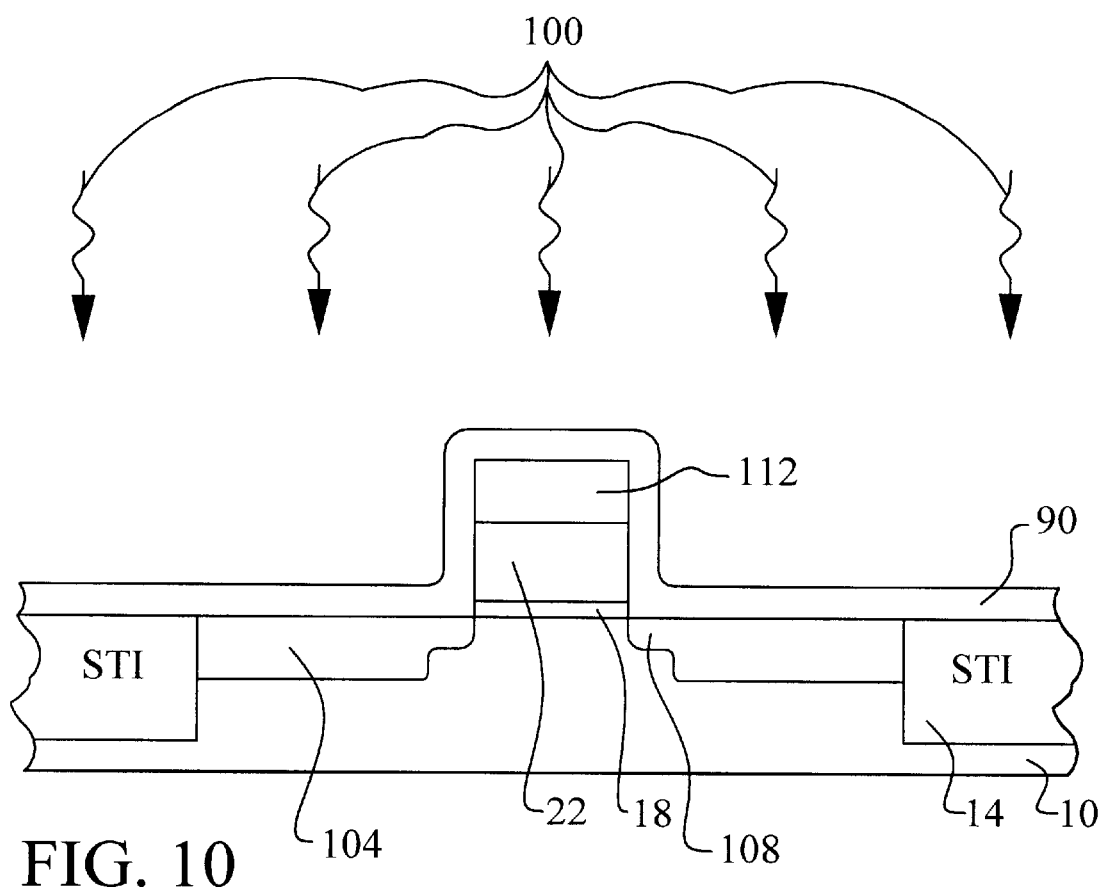

Referring now to FIG. 10, an important feature of the present invention is illustrated. The semiconductor substrate 10 is irradiated with laser light 100. This irradiation causes the silicon in the deep amorphous layer 38 and in the shallow amorphous layer 74 to melt. The implanted ions in the pre-annealed source and drain junctions 54 diffuse into the deep amorphous layer 38. Meanwhile, ions in the pre-annealed source and drain extensions 84 diffuse into the shallow amorphous layer 74. In this way, the source and drain junctions 104 and the source and drain extensions 108 for the transistor are formed simultaneously. Only one laser anneal 100 is required to drive in and to activate both the source and drain junctions 104 and the source and drain extensions 108. Note that the laser irradiation 100 also causes ions in the heavily doped region 58 of the gate 22 to diffuse and to form a heavily doped junction 112 in the gate.

The laser light fluence is carefully controlled so that the temperature of the silicon only rises sufficiently to melt the deep amorphous layer 38 and the shallow amorphous layer 74 in the silicon. The bulk of the crystalline silicon in the semiconductor substrate 10 below the amorphous layers 38 and 74 does not melt. The dopant diffusion is therefore limited to the previously defined amorphous layers 38 and 74. However, it may be necessary to melt a portion of the crystalline substrate that is adjacent to the amorphous layer in order to completely anneal the damages caused by the pre-amorphization implants 30 and 70. It is therefore possible to create very shallow, yet very abrupt, junctions. In addition, the high re-growth velocity of the amorphous silicon layers 38 and 74 enables the silicon to re-crystallize from the underlying semiconductor substrate 10. Finally, the amorphous layer 34 of the gate re-crystallizes from the underlying polysilicon layer 22 and becomes a polycrystalline layer upon re-crystallization. Additional annealing of residual defects (if any) is also provided during the subsequent silicidation process.

The laser light 100 wavelength is preferably between about 157 nanometers and 308 nanometers. The laser light 100 fluence is controlled between about 0.1 Joules/cm$^2$ and 1.5 Joules/cm$^2$. The source and drain junctions 104 so formed have a depth of between about 300 Angstroms and 1,500 Angstroms and a concentration of between about $1\times10^{18}$ atoms/cm$^3$ and $6\times10^{20}$ atoms/cm$^3$. The source and drain extensions 108 so formed have a depth of between about 100 Angstroms and 600 Angstroms and a concentration of between about $1\times10^{18}$ atoms/cm$^3$ and $6\times10^{20}$ atoms/cm$^3$.

An important feature of the present invention is that the source and drain extensions have not been annealed until this step. Since the silicon has been pre-amorphized to two different depths, the final junction depths are defined while both the deep junctions and the shallow extensions are annealed or activated in a single step.

Figure 11:
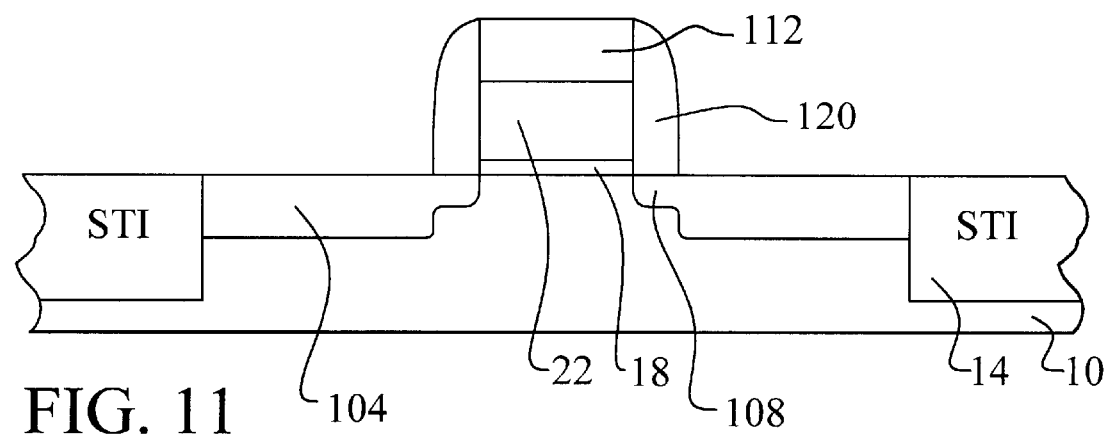

Referring now to FIG. 11, the capping layer 90 may now be removed. A permanent sidewall spacer 120 may be formed to provide bridging protection during a subsequent silicidation process. The manufacture of the MOS transistor device may then be completed using conventional means. The permanent sidewall spacers 120 may comprise, for example, silicon dioxide (SiO$_2$) or silicon nitride (Si$_3$N$_4$)

The advantages of the present invention may now be enumerated. First, a method for forming abrupt, ultra-shallow source and drain extensions and deep source and drain junctions has been achieved. Precise control of doping profile and activation is demonstrated by the combination of a pre-amorphization and laser annealing. Through the use of two, separate amorphization steps, excellent control and process margin is achieved for both the source and drain junctions and the extensions. Sidewall spacer over etching is not necessary.

As shown in the preferred embodiments, the present invention provides a very manufacturable process for forming MOS transistor device with abrupt, shallow junctions in an integrated circuit device. The use of a laser anneal to selectively melt only the amorphized or damaged silicon enables careful control of implanted dopant diffusion. Deep source and drain junctions and shallow source and drain extensions for sub-0.1 micron devices can be activated and diffused using a single laser anneal.

While the invention has been particularly shown and described with reference to the preferred embodiments thereof, it will be understood by those skilled in the art that various changes in form and details may be made without departing from the spirit and scope of the invention.

What is claimed is:

1. A method to form MOS transistors in the manufacture of an integrated circuit device comprising:

providing conductive gates overlying a semiconductor substrate;

forming temporary sidewall spacers on said gates;

thereafter implanting ions into exposed said semiconductor substrate to form a first amorphous layer having a first depth;

thereafter implanting ions into said first amorphous layer to form pre-annealed source and drain junctions;

thereafter removing said temporary sidewall spacers;

thereafter implanting ions into exposed said semiconductor substrate to form a second amorphous layer having a second depth shallower than said first depth;

thereafter implanting ions into said second amorphous layer to form pre-annealed source and drain extensions; and thereafter irradiating said semiconductor substrate with laser light to melt said first and second amorphous layers while crystalline regions of said semiconductor substrate remain in solid state to thereby diffuse ions in said pre-annealed source and drain junctions into said first amorphous layer and to diffuse ions in said source and drain extensions into said second amorphous layer and to complete formation of said MOS transistors.

2. The method according to claim 1 further comprising depositing a capping layer overlying said semiconductor substrate and said conductive gates after said step of implanting ions into said second amorphous layer to form pre-annealed source and drain extensions and before said step of irradiating wherein said capping layer protects said semiconductor substrate during said step of irradiating.

3. The method according to claim 2 wherein said capping layer comprises one of the group of: W, Ta, TiN, TaN, metal oxide, and metal nitride.

4. The method according to claim 1 further comprising forming permanent sidewall spacers on said conductive gates after said step of irradiating.

5. The method according to claim 1 wherein said step of irradiating is performed using a laser light with a fluence of between about 0.1 Joules/cm$^2$ and 1.5 Joules/cm$^2$ and a wavelength of between about 157 nanometers and 308 nanometers.

6. The method according to claim 1 wherein said step of implanting ions into exposed said semiconductor substrate to form a first amorphous layer comprises implanting one of the group of: Si, Ge, and Ar wherein said implantation performed at an energy of between about 10 KeV and 50 KeV and a dosage of between about $1\times10^{14}$ atoms/cm$^2$ and $1\times10^{16}$ atoms/cm$^2$.

7. The method according to claim 1 wherein said step of implanting ions into exposed said semiconductor substrate to form a second amorphous layer comprises implanting one of the group of: Si, Ge, and Ar wherein said implantation performed at an energy of between about 3 KeV and 30 KeV and a dosage of between about $1\times10^{14}$ atoms/cm$^2$ and $1\times10^{16}$ atoms/cm$^2$.

8. A method to form MOS transistors in the manufacture of an integrated circuit device comprising:

provision conductive gates overlying a semiconductor substrate;

forming temporary sidewall spacers on said conductive gates;

thereafter implanting ions into exposed said semiconductor substrate to form a first amorphous layer having a first depth wherein said ions comprise one of the group of: Si, Ge, and Ar;

thereafter implanting ions into said first amorphous layer to form pre-annealed source and drain junctions;

thereafter removing said temporary sidewall spacers;

thereafter implanting ions into exposed said semiconductor substrate to form a second amorphous layer having a second depth shallower than said first depth wherein said ions comprise one of the group of: Si, Ge, and Ar;

thereafter implanting ions into said second amorphous layer to form pre-annealed source and drain extensions;

thereafter depositing a capping layer overlying said semiconductor substrate and said conductive gates; and thereafter irradiating said semiconductor substrate with laser light to melt said first amorphous layer and said second amorphous layer while crystalline regions of said semiconductor substrate remain in solid state to thereby diffuse ions in said pre-annealed source and drain junctions into said first amorphous layer while ions in said source and drain extensions diffuse into said second amorphous layer and to complete the manufacture of said MOS transistors wherein the presence of said capping layer protects said semiconductor substrate during said irradiating.

9. The method according to claim 8 wherein said capping layer comprises one of the group of: W, Ta, TiN, TaN, metal oxide, and metal nitride.

10. The method according to claim 8 further comprising:

removing said capping layer after said step of irradiating; and thereafter forming permanent sidewall spacers on said conductive gates.

11. The method according to claim 10 wherein said permanent sidewall spacer comprises one of the group of: $SiO_2$ and $Si_3N_4$.

12. The method according to claim 8 wherein said step of irradiating is performed using a laser light with a fluence of between about 0.1 Joules/cm$^2$ and 1.5 Joules/cm$^2$ and a wavelength of between about 157 nanometers and 308 nanometers.

13. The method according to claim 8 wherein said step of implanting ions into exposed said semiconductor substrate to form a deep amorphous layer comprises an energy of between about 10 KeV and 50 KeV and a dosage of between about $1 \times 10^{14}$ atoms/cm$^2$ and $1 \times 10^{16}$ atoms/cm$^2$.

14. The method according to claim 8 wherein said step of implanting ions into exposed said semiconductor substrate to form a shallow amorphous layer comprises an energy of between about 3 KeV and 30 KeV and a dosage of between about $1 \times 10^{14}$ atoms/cm$^2$ and $1 \times 10^{16}$ atoms/cm$^2$.

15. A method to form MOS transistors in the manufacture of an integrated circuit device comprising:

providing conductive gates overlying a semiconductor substrate;

forming temporary sidewall spacers on said conductive gates;

thereafter implanting ions into exposed said semiconductor substrate to form a first amorphous layer having a first depth wherein said ions comprise one of the group of: Si, Ge, and Ar;

thereafter implanting ions into said first amorphous layer to form pre-annealed source and drain junctions;

thereafter removing said temporary sidewall spacers;

thereafter implanting ions into exposed said semiconductor substrate to form a second amorphous layer having a second depth shallower than said first depth wherein said ions comprise one of the group of: Si, Ge, and Ar;

thereafter implanting ions into said second amorphous layer to form pre-annealed source and drain extensions;

thereafter depositing a capping layer overlying said semiconductor substrate and said conductive gates;

thereafter irradiating said semiconductor substrate with laser light to melt said first amorphous layer and said second amorphous layer while crystalline regions of said semiconductor substrate remain in solid state to thereby diffuse ions in said pre-annealed source and drain junctions into said first amorphous layer while ions in said source and drain extensions diffuse into said second amorphous layer and to thereby simultaneously form source and drain junctions and source and drain extensions wherein said capping layer protects said semiconductor substrate during said irradiating;

thereafter removing said capping layer; and thereafter forming permanent sidewall spacers on said conductive gates to complete the manufacture of said MOS transistors.

16. The method according to claim 15 wherein said capping layer comprises one of the group of: W, Ta, TiN, TaN, metal oxide, and metal nitride.

17. The method according to claim 15 wherein said permanent sidewall spacer comprises one of the group of: $SiO_2$ and $Si_3N_4$.

18. The method according to claim 15 wherein said step of irradiating is performed using a laser light with a fluence of between about 0.1 Joules/cm$^2$ and 1.5 Joules/cm$^2$ and a wavelength of between about 157 nanometers and 308 nanometers.

19. The method according to claim 15 wherein said step of implanting ions into exposed said semiconductor substrate to form a deep amorphous layer comprises an energy of between about 10 KeV and 50 KeV and a dosage of between about $1 \times 10^{14}$ atoms/cm$^2$ and $1 \times 10^{16}$ atoms/cm$^2$.

20. The method according to claim 15 wherein said step of implanting ions into exposed said semiconductor substrate to form a shallow amorphous layer comprises an energy of between about 3 KeV and 30 KeV and a dosage of between about $1 \times 10^{14}$ atoms/cm$^2$ and $1 \times 10^{16}$ atoms/cm$^2$.

* * * * *

UNITED STATES PATENT AND TRADEMARK OFFICE
CERTIFICATE OF CORRECTION

PATENT NO. : 6,391,731 B1  
DATED : May 21, 2002  
INVENTOR(S) : Yung Fu Chong, Kin Leong Pey and Alex See It is certified that error appears in the above-identified patent and that said Letters Patent is hereby corrected as shown below:

<u>Title page,</u>
Item [74], *Attorney, Agent, or Firm*, please delete "Douglas R. Schnabe", and replace with -- Douglas R. Schnabel --.

Signed and Sealed this

Nineteenth Day of November, 2002

*Attest:*

JAMES E. ROGAN
*Director of the United States Patent and Trademark Office*

*Attesting Officer*